United States Patent [19]

Cherniawski et al.

[11] Patent Number: 5,236,852
[45] Date of Patent: Aug. 17, 1993

[54] METHOD FOR CONTACTING A SEMICONDUCTOR DEVICE

[75] Inventors: Michael Cherniawski, Austin; Jeffrey M. Barker, Manor; Ronald E. Pyle; Vidya S. Kaushik, both of Austin, all of Tex.

[73] Assignee: Motorola, Inc., Schaumburg, Ill.

[21] Appl. No.: 950,333

[22] Filed: Sep. 24, 1992

[51] Int. Cl.$^5$ .................. H01L 21/283; H01L 21/335
[52] U.S. Cl. ...................................... 437/41; 437/186; 437/193; 437/200; 148/DIG. 19
[58] Field of Search ...................... 437/40, 41, 44, 193, 437/191, 46, 186, 200, 187; 148/DIG. 19, DIG. 147

[56] References Cited

U.S. PATENT DOCUMENTS

| | | | |
|---|---|---|---|
| 3,699,646 | 10/1972 | Vadasz | 437/191 |
| 4,164,461 | 8/1979 | Schilling | 204/192 |
| 4,208,781 | 6/1980 | Rao et al. | 437/46 |
| 4,290,185 | 9/1981 | McKenney et al. | 437/41 |
| 4,367,580 | 1/1983 | Guterman | 437/46 |
| 4,397,076 | 8/1983 | Honnigford et al. | 437/46 |
| 5,032,537 | 7/1991 | Yoshizumi et al. | 437/57 |
| 5,034,348 | 7/1991 | Hartswick et al. | 437/200 |
| 5,086,017 | 2/1992 | Lu | 437/200 |

FOREIGN PATENT DOCUMENTS 60-227469 4/1984 Japan.
61-174767 1/1985 Japan.
62-61358 9/1985 Japan.

OTHER PUBLICATIONS

R. C. Ellwanger et al., "The contact properties to TiSi2 ...", Tungsten and Other Refractory Metals for VLSI Applications II, Ed. Eliot K. Broadbent, pp. 385–393, MRS 1987.
P. Revesz et al., "Growth of titanium silicide on ion implanted silicon", Journal of Applied Physics, vol. 54, No. 4, Apr. 1983, pp. 1860–1864.
N. de Lanerolle et al., "Titanium silicide growth by rapid-thermal processing of Ti films ...," Journal of Vacuum Science and Technology B, vol. 5, No. 6, 1987, pp. 1689–1695.
H. K. Park et al., "Effects of ion implantation doping on the formation of TiSi2," Journal of Vaccum Science and Technology A, vol. 2, No. 2, 1984, pp. 264–268.
K. Maex et al., "Stability of As and B doped Si with respect to overlaying CoSi2 and TiSi2 thin films," Journal of the Material Research Society, vol. 4, No. 5, 1989, pp. 1209–1217.
Robert Beyers et al., "Titanium disilicide formation on heavily doped silicon substrates," Journal of Applied Physics, vol. 61, No. 11, 1987, pp. 5110–5117.
M. F. Tseng et al., "Effects of contact implantation on shallow titanium silicide contact," Extended Abstracts of The Electrochemical Society, vol. 89-1, May 1989, pp. 323–324.
S. W. Sun et al., "Effects of TiSix/TiNx/Al contact metallization ...," Material Research Society Symposium Proceedings, vol. 92, 1987, 165–170.
S. W. Sun et al., "Al/W/TiNx/TiSiy/Si Barrier ...," IEEE Transactions on Electron Devices, vol. 9, No. 2, 1988, pp. 71–73.

Primary Examiner—T. N. Quach
Attorney, Agent, or Firm—Maurice Jay Jones; James L. Clingan, Jr.

[57] ABSTRACT

An electrical contact (46) to a phosphorous doped polysilicon gate electrode (18) is formed by preventing arsenic, from a source and drain implant, from doping a portion (22) of the polysilicon gate electrode (18). A photoresist mask (20) covers a portion (22) of the polysilicon gate electrode (18) during the implant, thus preventing it from being doped. An electrical contact (46) is then formed to the masked portion (22) of the polysilicon gate electrode (18).

14 Claims, 2 Drawing Sheets

METHOD FOR CONTACTING A SEMICONDUCTOR DEVICE

FIELD OF THE INVENTION

This invention relates generally to semiconductor devices, and more specifically to a method for contacting a semiconductor device.

BACKGROUND OF THE INVENTION

The semiconductor industry is continually reducing device dimensions in order to meet performance and packing density requirements. As device dimensions are decreased, however, contact geometries are also reduced and this results in an increase in parasitic contact resistance. For devices with submicron geometries, this increase in parasitic contact resistance is substantial and it degrades device performance. Several techniques have been proposed for forming electrical contacts with low contact resistance. A silicided electrical contact approach is one of the most promising techniques for reducing contact resistance. In this process, a metal silicide layer is placed between the contact surface and the overlying metallization to form an ohmic or low resistance electrical contact to the underlying contact surface. The formation of silicided electrical contacts to doped polysilicon surfaces, however, has proved to be a reliability issue. In particular, silicided electrical contacts often delaminate from doped polysilicon surfaces. If this delamination occurs an open circuit is formed and the device becomes non-functional. Accordingly, a need exists for a process that forms electrical contacts to doped polysilicon surfaces.

SUMMARY OF THE INVENTION

The previously mentioned problems with existing electrical contact processes are overcome by the present invention. In one embodiment of the invention, electrical contact to a semiconductor device is formed by providing a substrate. A field isolation region is then formed within a portion of the substrate and the field isolation region defines an active region. A doped polysilicon member is then formed overlying the substrate. A mask is then formed overlying a first portion of the polysilicon member while leaving a second portion of the polysilicon member exposed. The first portion of the polysilicon member overlies a portion of the field isolation region, which is adjacent to the active region. A dopant is then implanted to form a source region and a drain region within the active region. The dopant is implanted into the second portion of the polysilicon member while the mask substantially prevents the dopant from being implanted into the first portion of the polysilicon member. The mask is then removed. A dielectric layer is formed overlying the polysilicon member. An opening is then formed in the dielectric layer and a contact portion of the first portion of the polysilicon member is exposed. An electrical contact is then formed to the contact portion.

These and other features, and advantages, will be more clearly understood from the following detailed description taken in conjunction with the accompanying drawings. It is important to point out that the illustrations may not necessarily be drawn to scale, and that there may be other embodiments of the present invention that are not specifically illustrated.

DETAILED DESCRIPTION OF A PREFERRED EMBODIMENT

Figure 1:
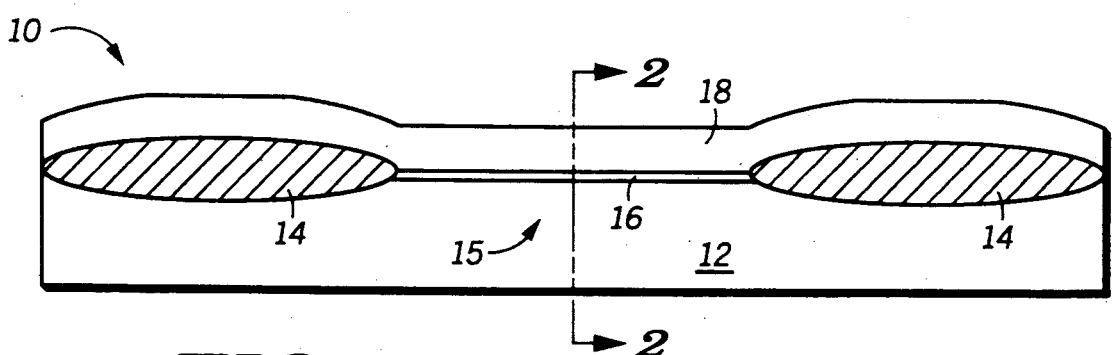
FIGS. 1-7 illustrate, in cross-section, process steps in accordance with one embodiment of the invention.
Figure 2:
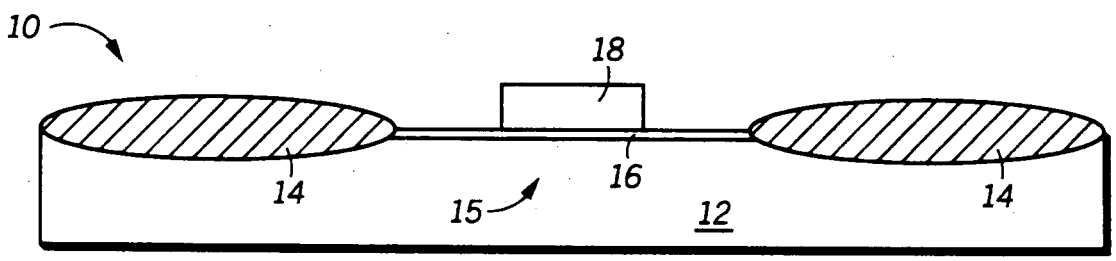

FIGS. 1 through 7 illustrate, in cross-section, process steps in accordance with one embodiment of the invention wherein a contact to a semiconductor device is formed. Shown in FIG. 1 is a portion 10 of an integrated circuit structure comprising a silicon substrate 12, a field isolation region 14, an active region 15, a gate dielectric layer 16, and a patterned polysilicon member 18. Field isolation region 14 is formed within a portion of silicon substrate 12 and defines active region 15. Field isolation region 14 is preferably formed using a conventional LOCOS isolation process. Following the formation of field isolation region 14, gate dielectric layer 16 is formed. A polysilicon film is then deposited and doped using conventional diffusion or implantation processes. The doped polysilicon film is then patterned, using conventional photolithographic patterning and etching techniques, to form polysilicon member 18. Polysilicon member 18 may serve as the control electrode for multiple transistors or for just a single transistor. Gate dielectric layer 16 is preferably a thermally grown silicon dioxide layer and polysilicon member 18 is preferably doped with phosphorous. Alternatively, polysilicon member 18 may be doped with arsenic. A cross section of FIG. 1 taken along the line 2—2 is shown in FIG. 2.

Figure 3:
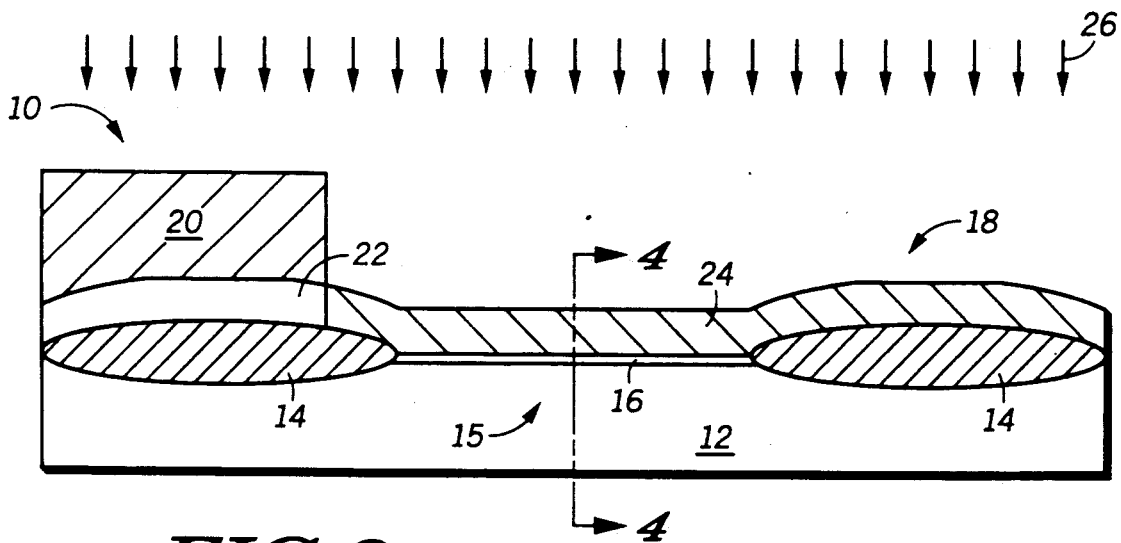

As shown in FIG. 3, a photoresist mask 20 is then formed using conventional photolithographic patterning techniques. Photoresist mask 20 overlies a first portion 22 of polysilicon member 18, while at the same time leaving a second portion 24 of polysilicon member 18 exposed. As shown in FIG. 3, first portion 22 of polysilicon member 18 overlies a portion of field isolation region 14 that is adjacent to active region 15. The significance of partially masking polysilicon member 18 will be made clear later. Using conventional implantation techniques, a dopant 26 is implanted into second portion 24, while at the same time photoresist mask 20 substantially prevents dopant 26 from being implanted into first portion 22. Thus the doping concentration in second portion 24 is increased while the doping concentration in first portion 22 remains substantially unchanged.

Figure 4:
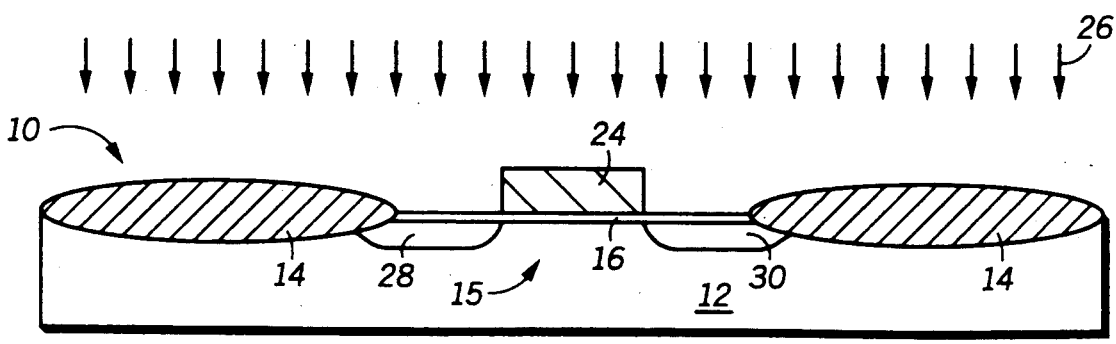

Shown in FIG. 4 is a cross sectional view of FIG. 3 taken along the line 4—4. As shown in FIG. 4, the implantation process is used to form a source region 28 and a drain region 30 within active region 15. Thus, polysilicon member 18 was only partially masked in order to allow source region 28 and drain region 30 to be formed. Source region 28 and drain region 30 are preferably formed with an arsenic implant. Alternatively, source region 28 and drain region may be formed with a phosphorous implant. After implantation, photoresist mask 20 is removed using conventional photoresist stripping techniques.

Figure 5:
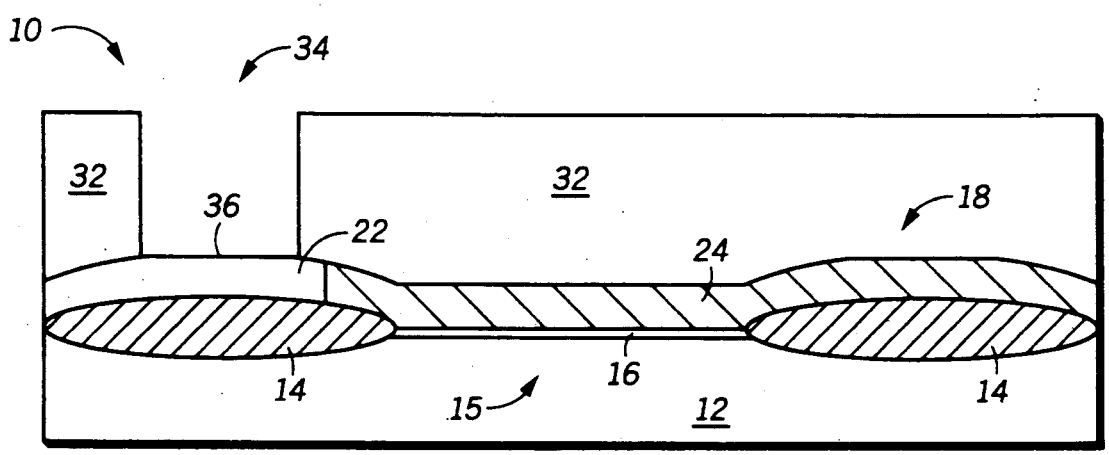

In FIG. 5, the process continues with the deposition of a dielectric layer 32 overlying polysilicon member 18. Using standard photolithographic patterning and etching techniques an opening 34 is formed in dielectric layer 32, and a contact portion 36 of first portion 22 is exposed.

Figure 6:
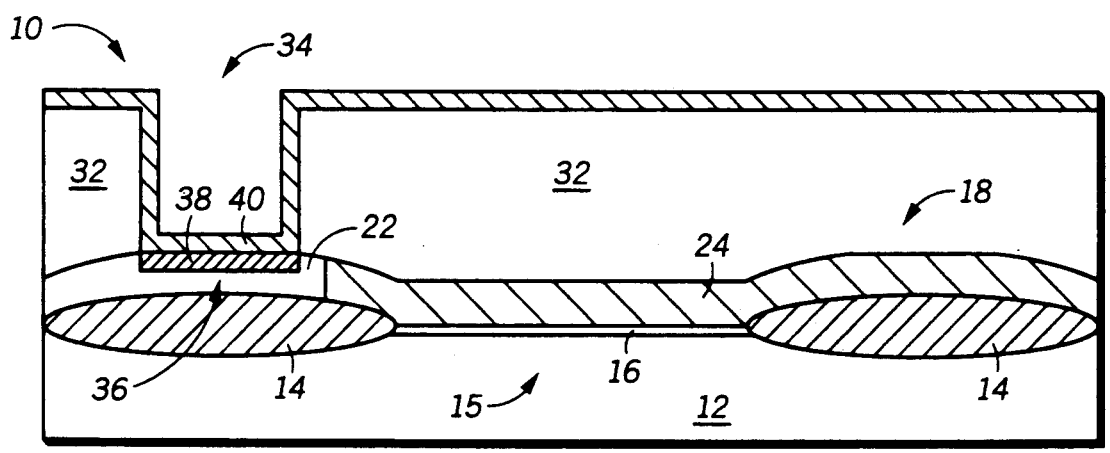

As shown in FIG. 6, the process continues with the formation of a silicide layer 38 and a barrier layer 40, which are electrically coupled to contact portion 36. In the preferred embodiment, silicide layer 38 is titanium silicide. Alternatively, silicide layer 38 may be cobalt silicide, platinum silicide, or nickel silicide. Barrier layer 40 is preferably titanium nitride. Alternatively, barrier layer 40 may be tungsten, titanium/tungsten or a different metal nitride layer. In the preferred embodiment a deposited film of titanium is rapid thermally annealed, in a nitrogen ambient, such that a composite layer of titanium silicide and titanium nitride is formed overlying contact portion 36. Other conventional processing techniques, however, may be used to form silicide layer 38 and barrier layer 40.

Figure 7:
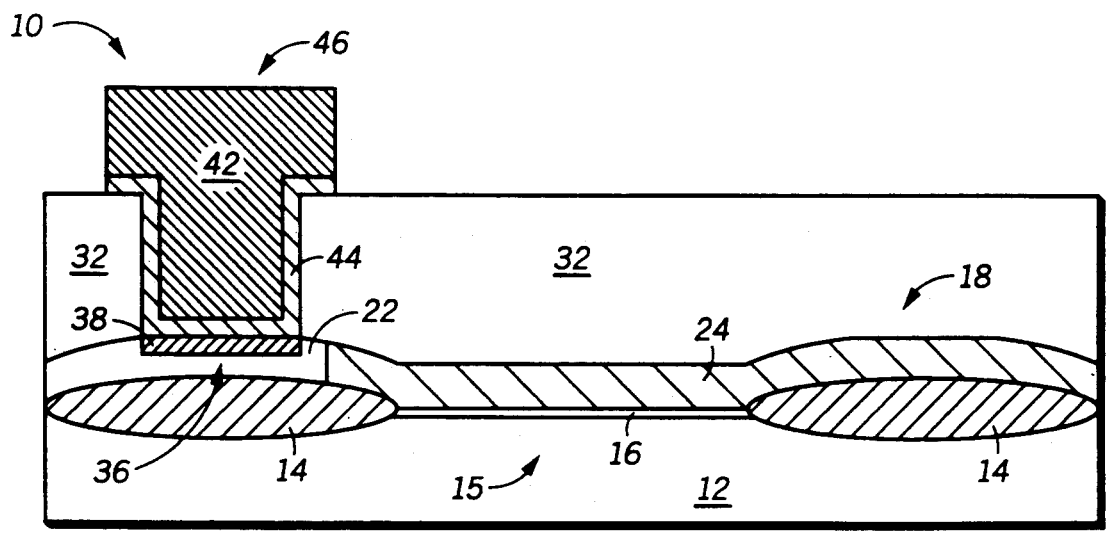

In FIG. 7, the process continues with the deposition of a layer of conductive material. In the preferred embodiment the layer of conductive material comprises aluminum. Alternatively, the layer of conductive material may also be tungsten or copper. Using conventional photolithographic patterning and etching processes a portion 42 of the layer of conductive material and a portion 44 of barrier layer 40 are then patterned. This results in the formation of an electrical contact 46 to contact portion 36, which is composed of silicide layer 38, portion 44, and portion 42, as shown in FIG. 7. Portion 42 is electrically coupled to portion 44 and silicide layer 38. Electrical contact 46, however, may also be formed using other conventional processing techniques. For example, after silicide layer 38 and barrier layer 40 have been formed, and before the layer of conductive material has been deposited and subsequently patterned, the contact opening may be filled with a tungsten plug.

The foregoing description and illustrations contained herein demonstrate many of the advantages associated with the present invention. In particular partially masking a polysilicon member during a source and drain implantation process allows an electrical contact to be formed to an underlying doped polysilicon surface. Moreover, the electrical contact to the doped polysilicon surface can be obtained without adversely effecting the source and drain fabrication process. Yet another advantage is that the present invention does not require an additional masking step. Existing source and drain implant masks may be modified to additionally mask that portion of the polysilicon member to which electrical contact is to be formed.

Thus it is apparent that there has been provided, in accordance with the invention, a method for contacting a semiconductor device that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, it is envisioned that electrical contacts to boron doped polysilicon may also be formed in a similar manner. It is also important to note that the present invention is not limited in any way to a particular source or drain structure. For example, a lightly doped source and drain structure may also be formed with this invention. Furthermore, other substrates such as silicon on insulator or silicon on sapphire could also be used. Therefore, it is intended that this invention encompass all such variations and modifications as fall within the scope of the appended claims.

We claim:

1. A method of contacting a semiconductor device comprising the steps of:
   providing a substrate;
   forming a field isolation region within a portion of the substrate wherein the field isolation region defines an active region;
   forming a doped polysilicon member overlying the substrate;
   forming a mask overlying a first portion of the polysilicon member and exposing a second portion of the polysilicon member, wherein the first portion of the polysilicon member overlies a portion of the field isolation region adjacent to the active region;
   implanting a dopant to form a source region and a drain region within the active region wherein the dopant is implanted into the second portion of the polysilicon member and the mask substantially prevents the dopant from being implanted into the first portion of the polysilicon member;
   removing the mask;
   forming a dielectric layer overlying the polysilicon member;
   forming an opening in the dielectric layer to expose a contact portion of the first portion of the polysilicon member; and
   forming an electrical contact to the contact portion.

2. The method of claim 1 wherein the electrical contact comprises at least one material selected from the group consisting of titanium silicide, cobalt silicide, titanium nitride, tungsten, and aluminum.

3. The method of claim 1 wherein the step of forming a doped polysilicon member is further characterized as forming a phosphorous doped polysilicon member.

4. The method of claim 1 wherein the step of forming a doped polysilicon member is further characterized as forming an arsenic doped polysilicon member.

5. The method of claim 1 wherein the step of implanting the dopant is further characterized as implanting arsenic.

6. The method of claim 1 wherein the step of implanting the dopant is further characterized as implanting phosphorous.

7. A method for contacting a semiconductor device comprising the steps of:
   providing a substrate;
   forming a field isolation region within a portion of the substrate wherein the field isolation region defines an active region;
   forming a doped polysilicon member overlying the substrate, wherein the polysilicon member serves as a control electrode for only a single transistor;
   forming a photoresist mask overlying a first portion of the polysilicon member and exposing a second portion of the polysilicon member;
   implanting a dopant to form a source region and a drain region within the active region wherein the dopant is implanted into the second portion of the polysilicon member and the mask substantially prevents the dopant from being implanted into the first portion of the polysilicon member;
   removing the photoresist mask;
   forming a dielectric layer overlying the polysilicon member;

forming an opening in the dielectric layer to expose a contact portion of the first portion of the polysilicon member; and forming an electrical contact to the contact portion.

8. The method of claim 7 wherein the electrical contact comprises at least one material selected from the group consisting of titanium silicide, cobalt silicide, titanium nitride, tungsten, and aluminum.

9. The method of claim 7 wherein the step of forming a doped polysilicon member is further characterized as forming a phosphorous doped polysilicon member.

10. The method of claim 7 wherein the step of forming a doped polysilicon member is further characterized as forming an arsenic doped polysilicon member.

11. The method of claim 7 wherein the step of implanting the dopant is further characterized as implanting arsenic.

12. The method of claim 7 wherein the step of implanting the dopant is further characterized as implanting phosphorous.

13. A method for making a contact to a semiconductor device comprising the steps of:
providing a substrate;
forming a field isolation region within a portion of the substrate wherein the field isolation region defines an active region;
forming a phosphorous doped polysilicon member overlying the substrate, wherein the polysilicon member serves as a control electrode for only a single transistor;
forming a photoresist mask overlying a first portion of the polysilicon member and exposing a second portion of the polysilicon member;
implanting arsenic to form a source region and a drain region within the active region wherein arsenic is implanted into the second portion of the polysilicon member and the mask substantially prevents arsenic from being implanted into the first portion of the polysilicon member;
removing the photoresist mask;
forming a dielectric layer overlying the polysilicon member;
forming an opening in the dielectric layer to expose a contact portion of the first portion of the polysilicon member; and
forming a layer of titanium silicide overlying and electrically coupled to the contact portion.

14. The method of claim 13 further comprising the step of:
forming a patterned layer of conductive material, the patterned layer of conductive material being electrically coupled to the layer of titanium silicide.

* * * * *